(12) United States Patent
Kassai

(10) Patent No.: US 7,663,369 B2
(45) Date of Patent: Feb. 16, 2010

(54) PATIENT COUCH, MAGNETIC RESONANCE IMAGING (MRI) APPARATUS, AND MRI METHOD

(75) Inventor: Yoshimori Kassai, Nasushiobara (JP)

(73) Assignees: Kabushiki Kaisha Toshiba, Tokyo (JP); Toshiba Medical Systems Corporation, Otawara-shi (JP)

(*) Notice: Subject to any disclaimer, the term of this patent is extended or adjusted under 35 U.S.C. 154(b) by 0 days.

(21) Appl. No.: 12/025,217

(22) Filed: Feb. 4, 2008

(65) Prior Publication Data

US 2008/0186027 A1 Aug. 7, 2008

(30) Foreign Application Priority Data

| Feb. 6, 2007 | (JP) | ............................. 2007-027292 |
| Nov. 1, 2007 | (JP) | ............................. 2007-285470 |

(51) Int. Cl.
*G01V 3/00* (2006.01)
(52) U.S. Cl. ........................................ 324/318; 600/415
(58) Field of Classification Search ................ 324/318; 600/415, 410
See application file for complete search history.

(56) References Cited

U.S. PATENT DOCUMENTS

| 4,122,587 A | * | 10/1978 | Weiss et al. ..................... 5/621 |
| 5,251,629 A | * | 10/1993 | Koizumi et al. ............. 600/410 |
| 7,069,068 B1 | * | 6/2006 | Ostergaard .................. 600/420 |
| 2006/0161087 A1 | * | 7/2006 | Carter et al. .................. 602/32 |
| 2006/0169872 A1 | | 8/2006 | Yoshimuta |

FOREIGN PATENT DOCUMENTS

| JP | 3-218757 | 9/1991 |
| JP | 2004-329524 | 11/2004 |
| JP | 2006-136618 | 6/2006 |

* cited by examiner

*Primary Examiner*—Louis M Arana
(74) *Attorney, Agent, or Firm*—Oblon, Spivak, McClelland, Maier & Neustadt, L.L.P.

(57) ABSTRACT

A magnetic resonance imaging (MRI) apparatus provides a belt-tension varying unit including a belt winding mechanism that performs reeling and unreeling a belt, a belt driving unit that drives the belt winding mechanism, and belt controlling unit that varies a tension of the belt corresponding to any one of a body length, a body weight, and a part to be imaged of a subject. The belt controlling unit varies the tension of the belt in such a manner that the belt controlling unit makes the tension of the belt large under a circumstance having high possibility where the subject moves, and makes the tension of the belt small under a circumstance having low possibility where the subject moves.

14 Claims, 6 Drawing Sheets

FIG.4

| IMAGED PART \ TYPE OF SUBJECT | CHILD | | | | | ADULT | | | | | ELDERLY PERSON | | | | |
|---|---|---|---|---|---|---|---|---|---|---|---|---|---|---|---|
| | A | B | C | D | E | A | B | C | D | E | A | B | C | D | E |
| HEAD | 2N | N | – | – | – | 3N | N | – | – | – | 2N | N | – | – | – |
| ABDOMEN - STRONG | – | – | 5N | N | – | – | – | 9N | 2N | – | – | – | 7N | N | – |
| ABDOMEN - WEAK | – | – | 4N | – | – | – | – | 7N | N | – | – | – | 5N | N | – |
| SPINAL CORD | – | N | 3N | – | – | – | N | 5N | – | – | – | N | 4N | – | – |
| LOWER LIMB | – | – | – | 2N | 4N | – | – | – | 4N | 7N | – | – | – | 3N | 5N |

FIXED REGION    A HEAD    B ARM    C LOWER BACK    D KNEE    E LEG     N: COEFFICIENT×f (BODY WEIGHT, BODY LENGTH)

PATIENT COUCH, MAGNETIC RESONANCE IMAGING (MRI) APPARATUS, AND MRI METHOD

CROSS-REFERENCE TO RELATED APPLICATIONS

This application is based upon and claims the benefit of priority from the prior Japanese Patent Applications No. 2007-027292, filed on Feb. 6, 2007 and No. 2007-285470, filed on Nov. 1, 2007; the entire contents of which are incorporated herein by reference.

BACKGROUND OF THE INVENTION

1. Field of the Invention

The present invention relates to a patient couch used for a diagnostic imaging apparatus, and to a magnetic resonance imaging (MRI) apparatus and an MRI method that perform MRI to a subject that is laid on a patient couch, and in particular, relates to a belt provided to a tabletop of the patient couch to fix the subject, and to an imaging procedure.

2. Description of the Related Art

A diagnostic imaging apparatus, which images a subject to perform a diagnostic imaging, includes a magnetic resonance imaging (MRI) apparatus, an X-ray computed tomography (CT) apparatus, a positron emission tomography (PET) apparatus, an X-ray diagnostic apparatus and the like.

The diagnostic imaging apparatuses such as the MRI apparatus, the X-ray CT apparatus, and the PET apparatus have a gantry that includes an opening formed thereon for performing the imaging. A subject is inserted into the opening and imaged therein. An X-ray diagnostic apparatus, for example, for circulatory organs has an imaging unit that includes an X-ray generator and an X-ray detector placed so as to oppose each other on both ends of a C-shaped arm. A subject is inserted (into the opening) between the X-ray generator and the X-ray detector and imaged therein.

The subject is laid on a tabletop of a patient couch arranged near the opening of the gantry to move the subject on the tabletop into the opening of the diagnostic imaging apparatus, whereby the subject is inserted into the diagnostic imaging apparatus.

In the imaging using the MRI apparatus, an imaging operation usually requires a comparatively long imaging time such as about one to five minutes. If the subject moves during the imaging operation, a blur or a slur occurs in an image. Further, if the subject largely moves, it may become impossible to diagnose. To solve these problems, the subject needs to be fixed appropriately on the tabletop. Conventionally, for example, a belt-shaped fixing tool having a rubber knitted therein, and a flexible material having elasticity, such as a sponge or a towel, to be tucked in the fixing tool, are used together to bind the subject onto the tabletop in a tying manner. As a method for connecting the belt, various methods such as a Velcro tape or a ratchet have been proposed. As a binding method, various methods have been proposed, such as stuffing many flexile materials between the belt and the subject without letting the belt have any elasticity, or increasing shrinkage of the belt. A conventional technology has been disclosed in, for example, JP-A 2006-136618 (KOKAI).

However, all these methods largely depend on the level of performance (e.g., a skill or an experience) of an operator who performs fixing operation. For example, even in fastening the belt, when the belt is locally fixed at only one position, a degree of freedom, which allows a rotation about a fixed region, remains, whereby a motion may occur at a part that is need to be imaged (an imaged part). Appropriately suppressing a body motion of the subject is not easy. For example, when a fixing strength is too weak, the motion cannot be restraint. When the fixing strength is too strong, the subject becomes tired in a last half period of the imaging, thereby inducing a reflective involuntary action of a muscle or the like, which makes the subject move.

SUMMARY OF THE INVENTION

According to one aspect of the present invention, a patient couch includes a tabletop on which a subject imaged by a diagnostic imaging apparatus is laid; a belt that fixes the subject onto the tabletop; and a belt-tension varying unit that makes a tension of the belt variable corresponding to the subject to be imaged.

According to another aspect of the present invention, a magnetic resonance imaging apparatus includes a tabletop on which a subject is laid; a belt that fixes the subject onto the tabletop; an MRI apparatus main unit that performs MRI to the subject; and a belt controlling unit that makes a tension of the belt variable corresponding to a progress state of the imaging of the subject.

According to still another aspect of the present invention, a magnetic resonance imaging apparatus includes an imaging-plan creating unit that creates an imaging plan in which a rest time is provided between two consecutive imaging protocols.

According to still another aspect of the present invention, a magnetic resonance imaging method includes making a tension of a belt that fixes a subject onto a tabletop variable corresponding to a progress state of the imaging of the subject.

According to still another aspect of the present invention, a magnetic resonance imaging method includes creating an imaging plan in which a rest time is provided between two consecutive imaging protocols.

BRIEF DESCRIPTION OF THE DRAWINGS

FIG. 4 is a view illustrating an example of a table storing therein imaged-part belt tension information that is a relation between an imaged part and belt positions to be used for the imaged part, and between the belt positions and tensions according to the first embodiment;

DETAILED DESCRIPTION OF THE INVENTION

Exemplary embodiments of a patient couch, a magnetic resonance imaging (MRI) apparatus and an MRI method according to the present invention will now be described in detail with reference to the accompanying drawings. It should be noted that the embodiments below are not intended to limit the scope of the present invention.

Figure 1:
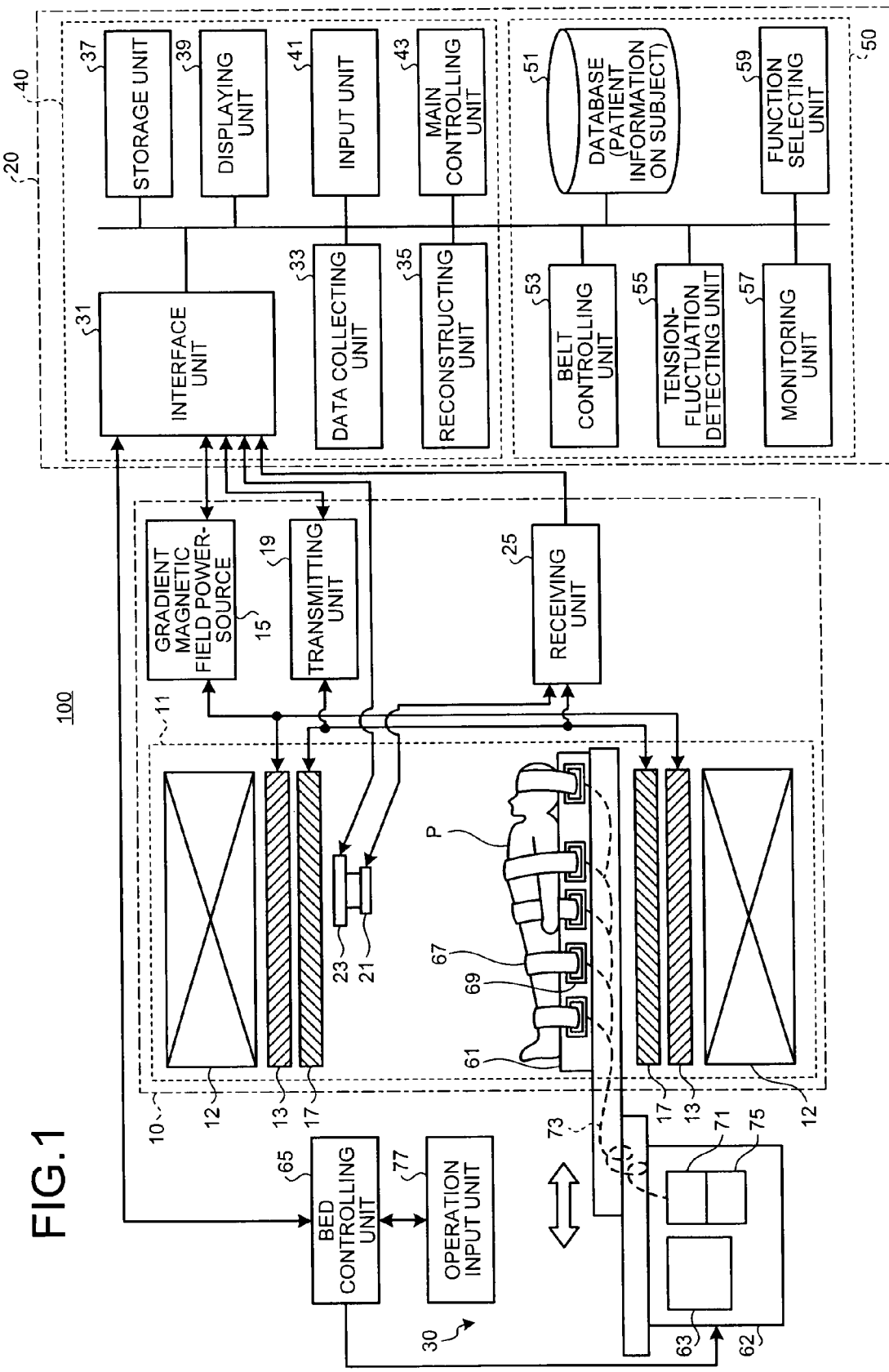
FIG. 1 is a system configuration view illustrating an MRI apparatus according to a first embodiment of the present invention.

FIG. 1 is a system configuration view illustrating a first embodiment of the MRI apparatus according to the present invention. An MRI apparatus 100 includes a main unit 10, an operator console unit 20, and a bed unit 30. The operator console unit 20 further includes a main system unit 40 and a belt system unit 50. Among these configurations, the main unit 10 and the main system unit 40 configure an MRI apparatus main unit that generates magnetic field on a subject P to perform imaging. The bed unit 30 and the belt system unit 50 configure a patient couch that places thereon the subject P, and then, to move the subject P into the MRI apparatus main unit.

The main unit 10 includes a gantry 11, a static magnetic field magnet 12, a gradient magnetic field coil 13, a gradient magnetic field power-source 15, a radio-frequency coil 17, a transmitting unit 19, a topical probe 21, a position adjusting mechanism 23, and a receiving unit 25.

The cylindrical static magnetic field magnet 12 is accommodated in the gantry 11 and generates an even static magnetic field in an internal space. A permanent magnet or a superconductive magnet, for example, is used as the static magnetic field magnet 12. Inside the static magnetic field magnet 12, the cylindrical gradient magnetic field coil 13 is arranged. The gradient magnetic field coil 13 includes three coils corresponding to axes of X, Y, and Z, respectively, each of which is mutually perpendicular. Each of the three coils separately receives current supplies from the gradient magnetic field power-source 15 to generate the gradient magnetic field, in which a magnetic field strength slants along each axis of X, Y, and Z. The direction of the Z axis is the same as the direction of the static magnetic field.

The cylindrical radio-frequency coil 17 is positioned inside the gradient magnetic field coil 13. The subject P, which is laid on a tabletop 61, is inserted into the radio-frequency coil 17. The radio-frequency coil 17 receives a supply of a radio-frequency pulse from the transmitting unit 19 to generate a radio-frequency magnetic field. The radio-frequency coil 17 also receives a magnetic resonance signal emitted from the subject P due to the radio-frequency magnetic field.

The transmitting unit 19 includes an oscillating unit, a phase selecting unit, a frequency converting unit, an amplitude modulating unit, and a radio-frequency power amplifying unit. The oscillating unit generates a radio-frequency signal of a resonance frequency unique to a nuclear of the subject in the static magnetic field. The phase selecting unit selects a phase of the radio-frequency signal. The frequency modulating unit modulates a frequency of the radio-frequency signal output from the phase selecting unit. The amplitude modulating unit modulates an amplitude of the radio-frequency signal output from the frequency modulating unit according to, for example, a sinc function. The radio-frequency power amplifying unit amplifies the radio-frequency signal output from the amplitude modulating unit. With these functions of the units together, the transmitting unit 19 transmits the radio-frequency pulse corresponding to Larmor frequency to the radio-frequency coil 17.

The topical probe 21 incorporates therein a radio-frequency coil smaller than the radio-frequency coil 17. The topical probe 21 is arranged inside the radio-frequency coil 17 and supported by the position adjusting mechanism 23. The radio-frequency coil incorporated in the topical probe 21 receives the magnetic resonance signal emitted from the subject P.

The receiving unit 25 includes a selector, a preamplifier, a phase sensitive detector, and an analog-digital converter. The selector selectively inputs the magnetic resonance signal output from the radio-frequency coil 17 and the topical probe 21. The preamplifier amplifies the magnetic resonance signal output from the selector. The phase sensitive detector detects a phase of the magnetic resonance signal output from the preamplifier. The analog-digital converter converts a signal output from the phase sensitive detector into a digital signal.

The bed unit 30 includes the tabletop 61, a supporting unit 62, a movement mechanism unit 63, a bed controlling unit 65, a belt 67, a belt winding mechanism 69, a belt driving unit 71, a wire 73, a tension detecting unit 75, and an operation input unit 77.

The subject P is laid on the tabletop 61. The movement mechanism unit 63 is mounted on the supporting unit 62 that supports the tabletop 61. The movement mechanism unit 63 moves the tabletop 61 back and forth in a sliding manner by use of an incorporated driving motor (not shown) to move the subject P into and out from the gantry 11 of the main unit 10. The bed controlling unit 65 drives the movement mechanism unit 63 based on a motion instruction input via an interface unit 31 or the motion instruction input from the operation input unit 77 to totally control the bed unit 30.

Five pairs of the belts 67 are provided at the tabletop 61 in a longitudinal direction at substantially even intervals. Each of the five pairs of belts 67 is spanned over from one side toward another side of the tabletop 61, and binds, for example, a head, a chest, an abdomen, a knee, and a leg of the subject P. Each of the belt is made of a fabric having elasticity and strength, and is pulled out from the belt winding mechanism 69 mounted on both sides of the tabletop 61.

Figure 2:
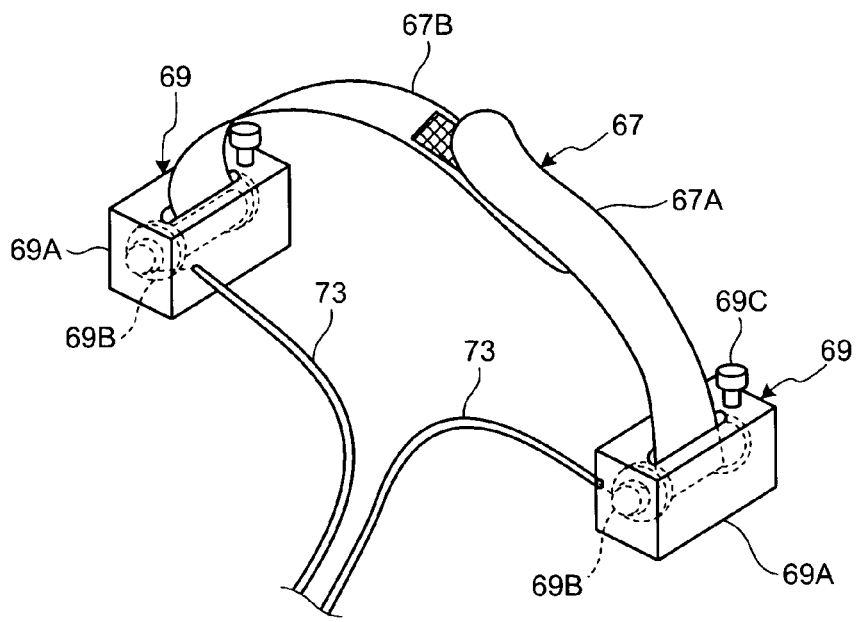
FIG. 2 is a perspective view illustrating a detail of a belt and a belt winding mechanism.

FIG. 2 is a perspective view illustrating details of the belt 67 and the belt winding mechanism 69. The belt 67 is divided into two belts 67A, and 67B. The belt winding mechanism 69 includes a substantially box-shaped case 69A, and a winding rod 69B that is rotatably and pivotally supported in the case 69A. An urging spring (not shown) slightly urges the winding rod 69B in a direction of winding the belt. One end of each of the belts 67A and 67B is wound around the winding rod 69B, and another end is pulled out from the case 69A. The belts 67A and 67B are allowed to be unreeled and reeled like a seatbelt of an automobile. A pair of Velcro tapes is provided at tips of the pulled-out sides of the belts 67A and 67B. The Velcro tape enables the belts 67A and 67B to be connected with each other.

At one end of the winding rod 69B, a tension adjusting knob 69C (tension retaining mechanism) is provided that makes a tip thereof contact with the urging spring (not shown), thereby pressing and stopping a rotation of the winding rod 69B by use of a predetermined urging force. In a state where the tension adjusting knob 69C is loosened, when the belts 67A and 67B are unreeled from and reeled into the case 69A and are adjusted to predetermined lengths thereof, and then, the tension adjusting knob 69C is tightened, the winding rod 69B is pressed and stopped due to the predetermined urging forth corresponding to the screwed length of the tension adjusting knob 69C. This structure allows manual operation to adjust the belt length and a belt tension irrelevantly with an operation performed by the system. The belt winding mechanism 69 and the tension adjusting knob 69C configure a belt-tension varying unit during the manual operation. The tension adjusting knob 69C is an additional configuration, which is not mounted when not required for the system.

The wire 73, which is a covered wire and extends toward the belt driving unit 71, is connected to another end of the winding rod 69B. The wire 73 has the same structure as that of a wire used in, for example, a brake of a bicycle. However, the wire 73 is made of a resin and a fiberglass so as not to disturb the magnetic field of the MRI apparatus. The belt driving unit 71 transmits driving force to the winding rod 69B via the wire 73, thereby rotating the winding rod 69B to retain the belt length and the belt tension at predetermined values. During an automatic operation, in which the belt driving unit 71 controls the belt winding mechanism 69, the tension adjusting knob 69C is kept being released.

Figure 3:
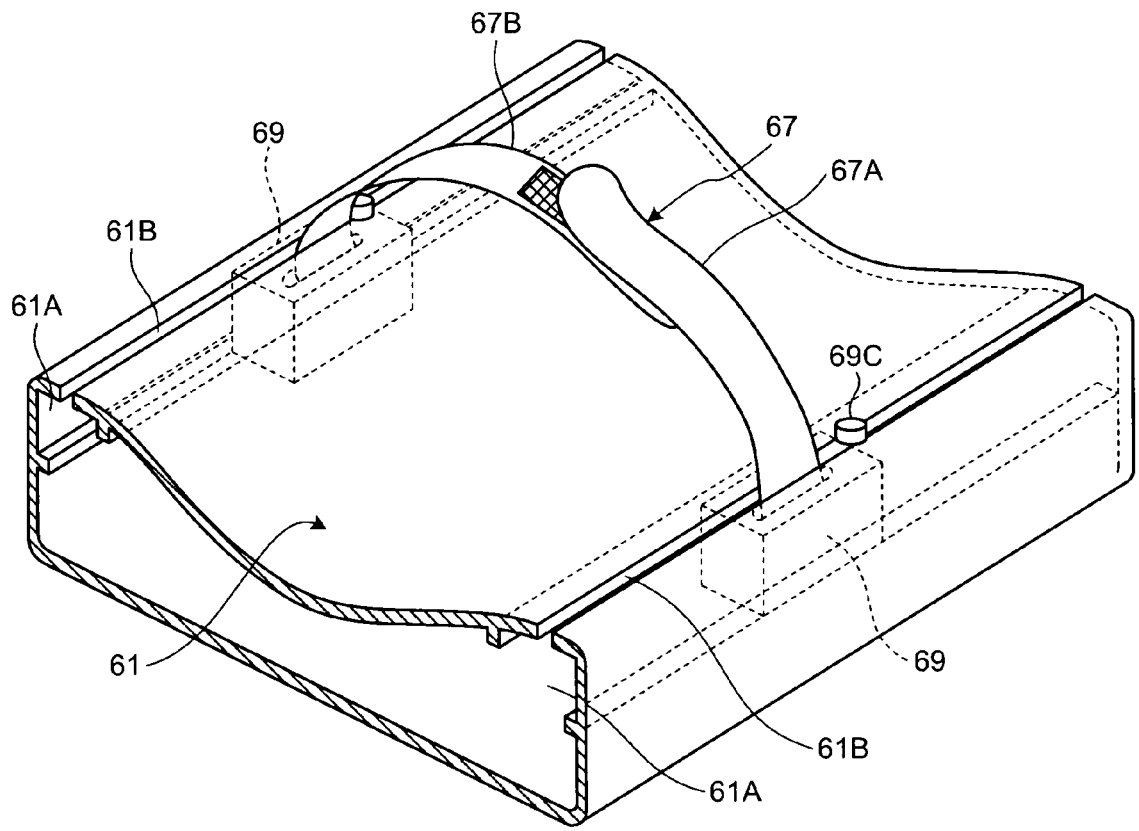
FIG. 3 is a perspective view illustrating the belt winding mechanism embedded in a tabletop.

FIG. 3 is a perspective view illustrating a state of the belt winding mechanism 69 embedded in the tabletop 61. For easier understanding, FIG. 3 enlarges the belt winding mechanism 69 relative to the tabletop 61. Guiding units 61A, which extend toward the longitudinal direction, are provided at both sides inside the tabletop 61. The guiding unit 61A includes a protruding portion that is formed along an entire length inside the tabletop 61. The guiding unit 61A accommodates and guides the belt winding mechanism 69, allowing the belt winding mechanism 69 to slide in the longitudinal direction of the tabletop 61. A slit 61B is formed on an upper surface of the tabletop 61 along the guiding unit 61A. The belts 67A and 67B, and the knob of the tension adjusting knob 69C are pulled out onto the tabletop 61 through the slit 61B. Such structure enables a position of the belt 67 to be adjusted in the longitudinal direction of the tabletop 61, when a length of the subject P changes or the subject P is laid on the tabletop 61 in a reverse direction.

Referring back to FIG. 1, the supporting unit 62 of the bed further includes the belt driving unit 71. The belt driving unit 71 incorporates a plurality of stepping motors (not shown) as a driving source corresponding to each belt. Each of the wire 73, which extends from the belt winding mechanism 69, is connected with the motor. The belt driving unit 71 takes in and out the wire 73 in response to the motion instruction from the belt system unit 50 (a belt controlling unit 53) or to the motion instruction from the operation input unit 77 provided at the gantry 11 to activate the belt winding mechanism 69. As a result, each belt is controlled so as to have a predetermined tension and a predetermined length. When the apparatus is in a manual mode, an operator can manually adjust the length and the tension of each belt by inputting the motion instruction via the operation input unit 77. The belt winding mechanism 69, the belt driving unit 71, and the operation input unit 77 configure the belt-tension varying unit during the automatic operation (manual operation) that is performed from the bed unit 30 side. The belt winding mechanism 69, the belt driving unit 71, and the belt controlling unit 53 configure the belt-tension varying unit during the automatic operation (manual operation and system automatic operation) that is performed from the operator console unit 20 side.

The tension detecting unit 75 is provided adjacent to the belt driving unit 71. The tension detecting unit 75 detects a torque that is transmitted to each motor to calculate the belt tension from the torque. The belt tension detected by the tension detecting unit 75 is fed back to the belt driving unit 71. The belt driving unit 71 uses this feedback signal to perform the control in such a manner that the value of the belt tension becomes the same value as an instruction value. The belt tension is also transmitted to the operator console unit 20 side (belt system unit 50) from the tension detecting unit 75 via the bed controlling unit 65.

The tension detecting unit 75 has a first and a second threshold values per a belt. When the value of the belt tension of any one of the belts 67 becomes equal to or more than the first threshold value, a notifying mechanism such as a buzzer alerts (notifies). A signal, which indicates that the value of the belt tension has become equal to or more than the first threshold value, is simultaneously transmitted to the operator console unit 20 side (belt system unit 50). The belt controlling unit 53 receives the signal to indicate a warning (notification) on a displaying unit 39 in a form of a pop-up display. An alert (a small display that lets the operator know a caution or the warning) may notify the warning.

When the value of the belt tension becomes equal to or more than the second threshold value, the tension detecting unit 75 makes the belt 67 in a released state. Here, the released state is a state where the belt 67 can be freely pulled out from the belt winding mechanism 69. In this manner, the two threshold values have been set, and when the value of the belt tension becomes equal to or more than the second threshold value, the belt 67 is kept in the released state, thereby preventing the belt 67 from not being unfastened in a case of an emergency.

The operation input unit 77 is provided at the bed controlling unit 65 while being connected therewith. The operation input unit 77 is practically mounted on a side of the gantry 11 that accommodates the static magnetic field magnet 12 and the gradient magnetic field coil 13. An operation input signal input from the operation input unit 77 is transmitted to the belt driving unit 71 or the belt system unit 50 via the bed controlling unit 65. In this manner, the bed unit 30 side is allowed to perform the operation of the belt driving unit 71.

At the foot of the operator, who operates the operation input unit 77, a footswitch (not shown) is provided that makes the belt 67 in the released state in a case of an emergency. A similar footswitch is also provided at the operator console unit 20 side. When the belt 67 becomes in the released state under a situation where the tabletop 61 has been pulled out from the gantry 11, the subject P may be dropped from the tabletop 61. Therefore, the footswitch may be provided only at the gantry 11 side where the operator can visually observe the state of the tabletop 61.

The operator console unit 20 includes the main system unit 40 and the belt system unit 50 as described above. The main system unit 40 includes the interface unit 31, a data collecting unit 33, a reconstructing unit 35, a storage unit 37, the displaying unit 39, an input unit 41, and a main controlling unit 43.

To the interface unit 31, the gradient magnetic field powersource 15, the transmitting unit 19, the position adjusting mechanism 23, the receiving unit 25, and the bed controlling unit 65 are connected. The interface unit 31 communicates signals transmitted and received between these connected units and the operator console unit 20.

The data collecting unit 33 collects a digital signal output from the receiving unit 25 via the interface unit 31. The data collecting unit 33 stores in the storage unit 37 the collected digital data, that is, magnetic resonance signal data. The reconstructing unit 35 performs a reconstruction such as a post-processing, that is, Fourier transform to the magnetic resonance signal data stored in the storage unit 37 to obtain spectrum data of a desired nuclear spin in the subject P or image data.

The storage unit 37 stores the magnetic resonance signal data, and the spectrum data or the image data, per a subject P. The displaying unit 39 displays various information such as the spectrum data or the image data under the control of the main controlling unit 43. A display device such as a liquid crystal display instrument can be used as the displaying unit 39. The input unit 41 receives various instructions or information input by the operator. The main controlling unit 43 totally controls these units to control an imaging operation of the MRI apparatus main unit.

The belt system unit 50 includes a database 51, the belt controlling unit 53, a tension-fluctuation detecting unit 55, a monitoring unit 57, and a function selecting unit 59.

The database 51 stores therein patient information on the subject P or imaged-part belt tension information. A Radiology Information System (RIS) (not shown) or the input unit 41 of the MRI apparatus performs a registration of a patient. The database 51 stores therein the patient information such as sex, age, body length, and body weight. The imaged-part belt tension information is information that indicates a relation between an imaged part and belt positions used to the imaged part, and between the belt positions and tensions. The database 51 stores therein the imaged-part belt tension information. These information stored in the database 51 are allowed to be edited via the input unit 41.

The belt controlling unit 53 totally controls a drive of the belt 67. For example, the belt controlling unit 53 changes the tension of the belt 67 based on the patient information on the subject P stored in the database 51. The belt controlling unit 53 changes the tension of the belt 67 in conjunction with the imaging operation of the MRI apparatus main unit controlled by the main controlling unit 43.

The tension-fluctuation detecting unit 55 monitors the belt tension output from the tension detecting unit 75. When the value of the belt tension fluctuates by equal to or more than a predetermined value in a short time, the tension-fluctuation detecting unit 55 notifies this situation (displays an alert on the displaying unit 39).

The monitoring unit 57 receives the belt tension output from the tension detecting unit 75 to record a change in the belt tension accompanying an elapse of the imaging operation. The change in the belt tension recorded by the monitoring unit 57 can be checked after the completing of the imaging operation.

The function selecting unit 59 receives selections of various modes or functions relating to the belt control via the input unit 41 and retains them.

As basic controlling modes relating to the belt control, the following modes are prepared.

Tension Constant Mode

When this mode is selected, the belt controlling unit 53 performs a control so as to keep the tension constant, while making the length of the belt 67 variable.

Tension Variable Mode

When this mode is selected, the belt controlling unit 53 performs a control so as to fix the length of the belt 67 with a predetermined length, thereby fluctuating the tension due to a body motion of the subject P.

Belt-Length Priority Mode

When this mode is selected, the belt controlling unit 53 basically controls the length of the fixed belt to be in a constant state. When the tension, which has equal to or more than a predetermined value, is placed, the belt controlling unit 53 keeps the tension constant.

Tension Priority Mode

When this mode is selected, the belt controlling unit 53 basically changes the length of the fixed belt to perform a control so as to keep the tension constant. When the belt length extends by equal to or more than a predetermined value compared with a default, the belt controlling unit 53 fixes the belt length so as not to be extended anymore, even when the tension is changed.

The operations according to the first embodiment will now be described below. The receiving unit 25 receives the magnetic resonance signal output from the radio-frequency coil 17 and the topical probe 21 to generate the magnetic resonance signal data. The main controlling unit 43 performs the imaging of an entire of the subject P based on, for example, the magnetic resonance signal data from the radio-frequency coil 17. The main controlling unit 43 performs the imaging per a local such as the head or the abdomen of the subject P based on the magnetic resonance signal data from the topical probe 21. The imaging operation as mentioned above is performed based on an imaging protocol such as a T1 weighted image, a T2 weighted image, a magnetic resonance angiography (MRA), a diffusion weighted imaging (DWI), and a fluid attenuated inversion recovery (FLAIR).

For example, when imaging the head, although it is necessary to fix a region around an arm, it is not required to fix the region so strongly, whereas it is necessary to strongly fix the head and to slightly fix the arm. On the other hand, when imaging the abdomen, it is important to directly and strongly fix the abdomen, which is a subject of the imaging, for the purpose of restraining a respiratory body motion, whereas it is not required to fix the head. In this manner, the clinical purpose and the combination of the imaged parts determine the belt tension.

At the time of the imaging operation, the belt controlling unit 53 changes the tension of the belt 67 based on the patient information on the subject P and the imaged-part belt tension information stored in the database 51. FIG. 4 is a view illustrating an example of a table storing the imaged-part belt tension information. In FIG. 4, A to E respectively indicates a region to be fixed by the belt 67. A indicates the head, B indicates the arm, C indicates the lower back, D indicates the knee, R indicates the leg, and N indicates a predetermined coefficient. A product, where a number in FIG. 4 is multiplied by a function f that varies depending on the body weight or the body length, determines the tension of the belt 67. For example, when imaging the head of an adult, the belt 67 fixes the head and the arm, and fixes the head with force of 3N multiplied by the function f, and fixes the arm with force of N multiplied by the function f.

Basically, the belt controlling unit 53 makes the belt tension large for the subject whose physical strength is assumed to be large, and makes the belt tension small for the subject whose physical strength is assumed to be small based on the patient information of the subject. In other words, because the larger physical strength (physically stronger) the person has, the more possibility where the person will move. Therefore, the belt controlling unit 53 makes the belt tension large for the subject whose body weight, the body length are large, whereas making the belt tension small for the subject whose body weight, the body length are small. For a similar reason, the belt controlling unit 53 makes the belt tension large for the subject who is young (an adult), whereas making the belt tension small for the subject who is old (an elderly person) or further younger (a child). For further similar reason, the belt controlling unit 53 makes the belt tension small for the female subject, whereas making the belt tension large for the male subject.

As an extensional example of the system, a learning mode may be incorporated in the system, and the belt system unit 50 may read therein via the tension detecting unit 75 the belt tension at the time when a skilled operator has set, and based on this data, the system may revise the imaged-part belt tension information.

As a further extensional example of the system, the system may perform a judgement using an identification data (ID) at the time of login to determine a degree of skill of an operator. When the skilled operator uses the apparatus, the system may give priority to a setting value set through the manual operation performed by the operator, and the system may enter the learning mode to revise the imaged-part belt tension information. On the other hand, when a less skilled operator uses the apparatus, the system may give priority to the setting value stored in the database 51.

Figure 5:
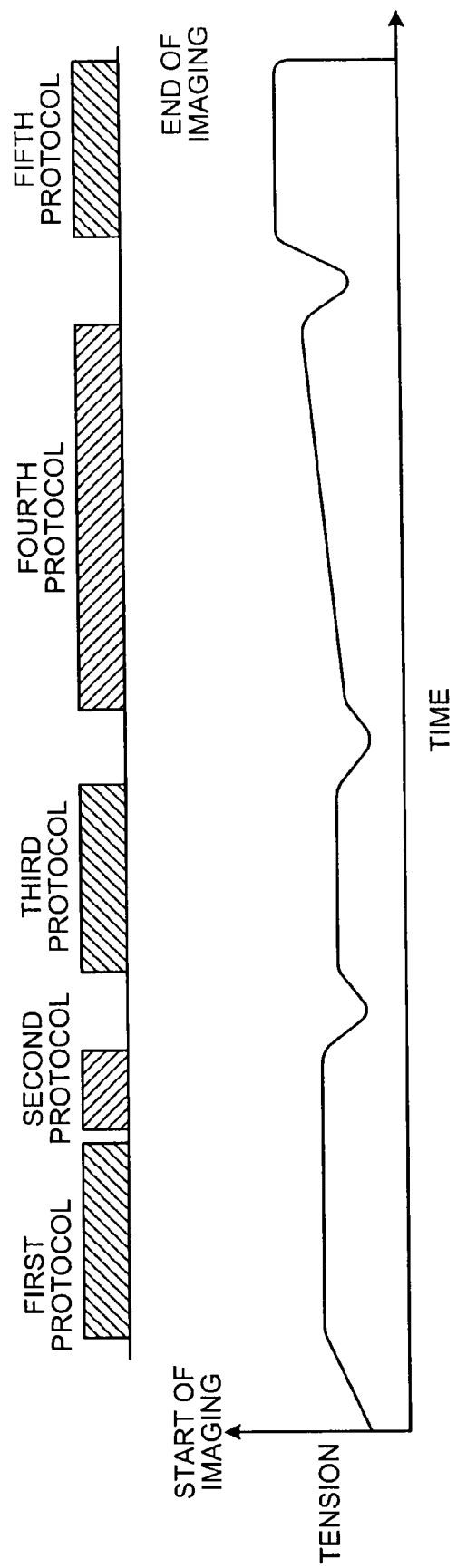
FIG. 5 is a timing chart illustrating an example of protocol belt-tension information that indicates a relation between imaging protocols that are continuously performed and a belt tension according to the first embodiment.

When the imaging operations continuously perform a plurality of the imaging protocols, the belt tension may be controlled based on an order of the imaging protocols. FIG. 5 is a timing chart illustrating an example of protocol belt-tension information that indicates a relation between the imaging protocols continuously performed and the belt tension. Specifically, FIG. 5 indicates a ratio of changes in the belt tension in the imaging protocols of imaging the head. In FIG. 5, a horizontal axis indicates the elapse of time, that is, a progress of the imaging protocols, and a vertical axis indicates the ratio of changes in the belt tension. As shown in FIG. 5, it is also effective to perform a dynamic control, as the control of the belt tension during the imaging operation, including loosening the belt tension according to timing when a rest time of the subject P is set between the imaging, not to tighten the belt with a constant tension during the imaging operation. In this case, as the basic tension control, the belt-length priority mode is selected.

In FIG. 5, during a first imaging protocol, which is a period of time when the imaging has been started and a motion is likely to occur, the belt controlling unit 53 fixes the belt with a little stronger tension. Compared with this, after a second imaging protocol, the belt controlling unit 53 loosens the tension. The belt controlling unit 53 further loosens the tension during the rest time between the second imaging protocol and a third imaging protocol.

Because the MRA, which is a forth imaging protocol, has longer imaging time compared with other imaging protocols and is the imaging protocol that is susceptible to the body motion, it is important to fix the subject P. Specifically, the subject P has been notified in advance that the imaging would take a long time, and has been requested to cooperate not to move, and then, the control is performed where the tension becomes gradually strengthened during the imaging operation.

The protocol belt-tension information, which is a relation between the imaging protocol and the belt tension, is made possible to be specified as an element that can be set in an entire plan of the imaging protocol as well as a breath-hold imaging or a dynamic imaging. The protocol belt-tension information can be realized as a part of a memory function of the imaging protocol.

When a function of monitoring is selected, the monitoring unit 57 monitors a state of the belt 67 during imaging (sequentially stores the tension and the belt length in the storage unit 37). For example, when the belt-length priority mode is selected, the monitoring unit 57 records time fluctuations of the tension. When the tension priority mode is selected, the monitoring unit 57 records time fluctuations of the belt length. A monitoring result is made possible to be checked in a retrospective manner after the completion of the imaging operation. That is, it is possible to check after the completion of the imaging operation at which timing the subject P has moved.

With the monitoring function, for example, when an artifact is found on an image after imaging, it is possible to check whether the body motion has occurred at the timing when the image has been imaged, thereby allowing to determine whether the artifact is attributed to the body motion of the subject P, or whether the artifact is attributed to other causes.

When an alert function is selected in addition to the monitoring function, the tension-fluctuation detecting unit 55 detects a minute motion (what is called "fidgeting"), which appears in advance of large motion, to display an alert on the displaying unit 39.

Utilizing the alarm function enables the operator to make an appropriate response tailored to a situation, including saying something to the subject P for relax, or cancelling an automatic start of the next imaging to provide the rest time before start.

As described above, in the first embodiment, it is possible to manage the tension of the belt, which fixes the subject, at an appropriate level, without depending on the skill of the operator. Therefore, it is possible to restrain the body motion of the subject during the imaging operation, and is possible to reduce image degradation attributable to the body motion of the subject.

The patient couch according to the first embodiment manages the tension of the belt, which fixes the subject, at the appropriate level without depending on the skill of the operator. Therefore, a desired effect can be obtained, even when the patient couch is employed not only in the MRI apparatus, but also in a diagnostic imaging apparatus such as an X-ray CT apparatus, a PET apparatus, and an X-ray diagnostic apparatus.

In the first embodiment, the tension of the belt, which fixes the subject, is controlled, whereby the body motion of the subject during the imaging is prevented. When continuous imaging are performed by use of a plural imaging protocols, providing a rest time between 2 continuous imaging can also prevent the body motion of the subject.

In a system used until a few years ago, the speed of preparing and transferring an imaging sequence for a controller has been dominant, compared with the execution speed of a computer. As a result, a spare time naturally occurred at a switchover timing from one pulse sequence to other pulse sequence. During the spare time, the patient (subject) could make himself or herself somewhat relax from a state where the body of the patient had been rigid to prevent the body motion. However, the improvement in the execution speed of the computer and the advancement in the transferring speed to the controller made it difficult for having the spare time.

When the imaging is continuously performed without any spare time, it has been empirically known that the body motion of the subject becomes large, if one imaging time exceeds four minutes. It has been also known that the patient becomes unstable due to fatigue, after approximately 20 minutes have passed during an inspection time of 30 minutes. At present, the operator tries to make the body motion so as not to become large, for example, by setting the rest time accordingly while observing the state of the patient or saying something to the patient. Even under the present situation where a contrast medium is used, the operator performs jobs including setting a stop point to restrain a scan from automatically moving and, during that time, to perform an injection work of the contrast medium and the like.

However, a less-experienced operator may continuously perform the imaging without providing any rest time, thereby putting a heavy strain on the patient. Accordingly, in a second embodiment of the present invention, the MRI apparatus that has incorporated therein the rest time in advance when planning the imaging will be described. The MRI apparatus according to the second embodiment provides, as a part of an imaging-plan creating function, a rest-time setting function that sets the rest time of roughly 15 to 30 seconds during which the patient can relax, once in about 3 to 4 minutes while combining with automatic voice and the like.

Figure 6:
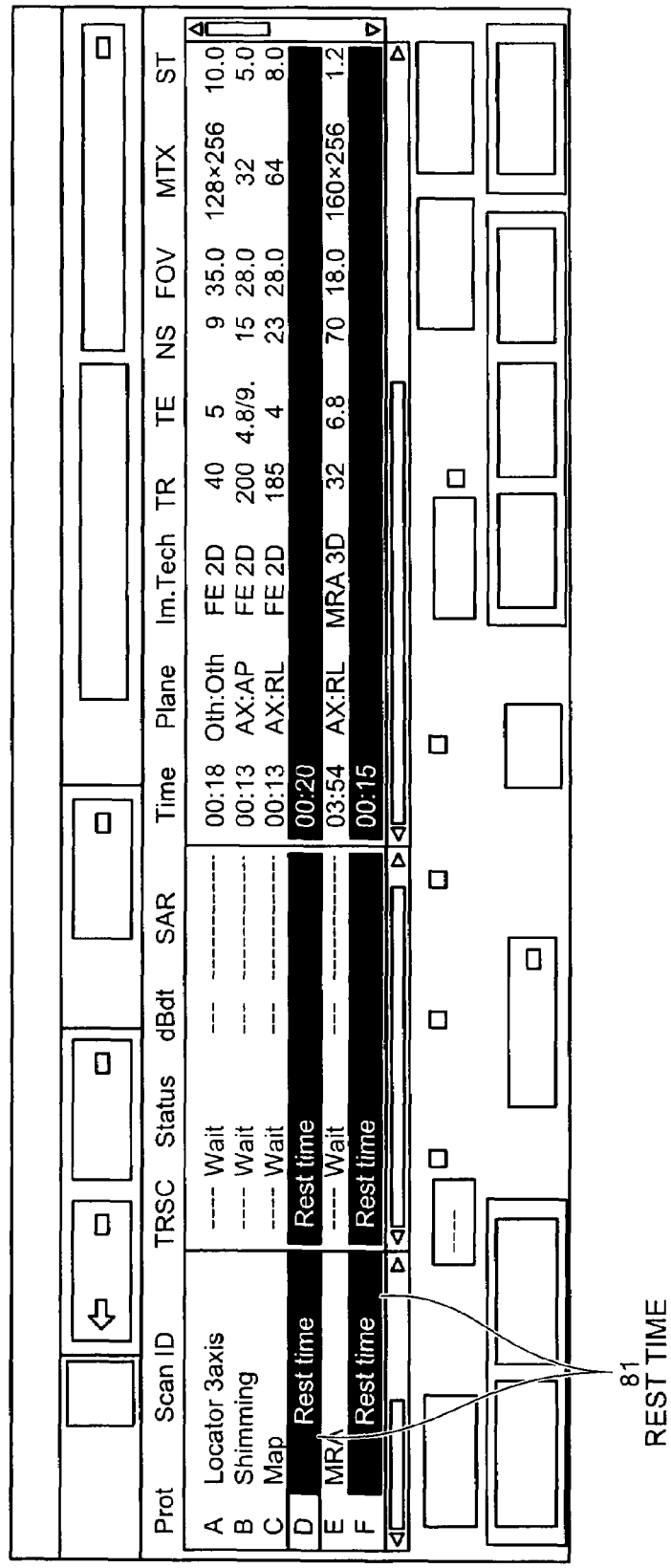
FIG. 6 is a schematic view illustrating an example of an imaging plan screen where rest times are automatically set according to a second embodiment of the present invention.
Figure 7:
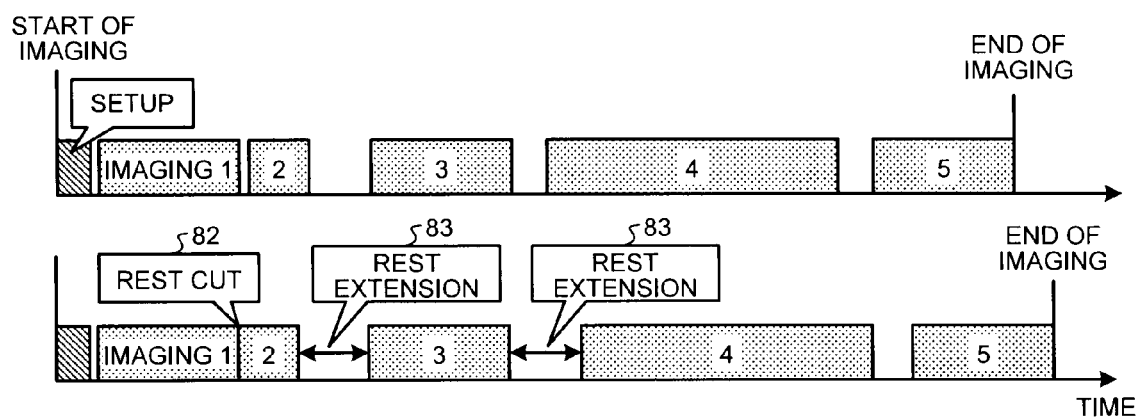
FIG. 7 is a schematic view illustrating an example of rest-time editing according to the second embodiment.

As specific rest-time setting methods, the MRI apparatus according to the second embodiment provides two methods. One method is to, as shown in FIG. 6, automatically set a rest time 81 when planning the imaging plan, thereby making the operator not required to pay much attention to the rest time. Another method is to, as shown in FIG. 7, display an entire imaging operation time, where the operator rewrites a value of a rest cut 82 or a rest extension 83 or the like for a preset value by an easy operation such as a mouse operation.

When automatically setting the rest time, the MRI apparatus according to the second embodiment sets the rest time as follows: it gradually makes the rest time longer, the closer the imaging proceeds to an end of the imaging; it takes a longer rest time before long imaging time. When performing the breath-hold imaging that is used in the imaging of an abdomen or a heart, the MRI apparatus according to the second embodiment provides the rest time of about 1 minute per one breath-hold time of roughly 20 seconds.

Figure 8:
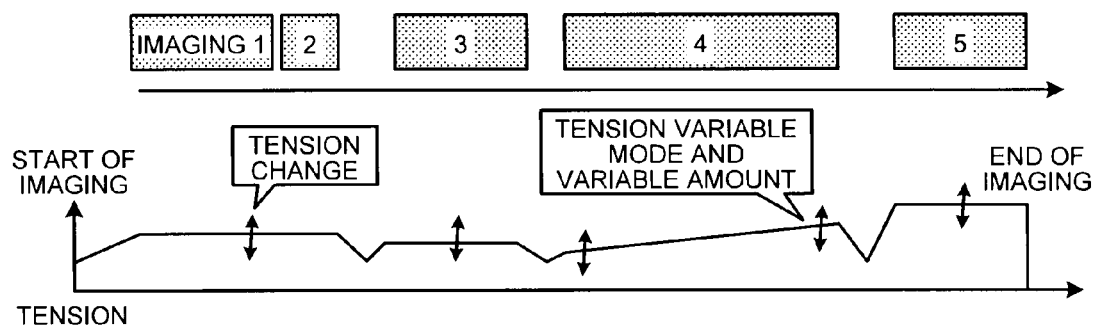
FIG. 8 is a schematic view illustrating an example of a tension change according to the second embodiment.

As shown in FIG. 8, the MRI apparatus according to the second embodiment provides a tension changing function, with which the operator performs a tension change or a change of the controlling mode by an easy operation such as a mouse operation, in addition to the rest-time setting function.

In this manner, the MRI apparatus according to the second embodiment provides the rest-time setting function or the tension changing function, thereby enabling the body motion of the patient during the imaging to be suppressed, and allowing reduction of the image degradation due to the body motion of the patient.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A patient couch, comprising:
    a tabletop on which a subject imaged by a diagnostic imaging apparatus is laid;
    a belt that fixes the subject onto the tabletop; and
    a belt-tension controlling unit that automatically controls a tension of the belt by using a table that stores the tension corresponding to the subject to be imaged.

2. The patient couch according to claim 1, wherein
    the table stores the tension corresponding to at least one of a body length, a body weight, and a part to be imaged of the subject.

3. A magnetic resonance imaging (MRI) apparatus comprising:
    a tabletop on which a subject is laid;
    a belt that fixes the subject onto the tabletop;
    an MRI apparatus main unit that performs MRI to the subject; and
    a belt controlling unit that automatically controls a tension of the belt by using a table that stores the tension corresponding to an imaging progress state of the subject.

4. The MRI apparatus according to claim 3, wherein
    the belt controlling unit makes the tension of the belt large under a circumstance having high possibility where the subject moves, and makes the tension of the belt small under a circumstance having low possibility where the subject moves, corresponding to an imaging procedure of an imaging operation performed by the MRI apparatus main unit.

5. The MRI apparatus according to claim 3, wherein
    the belt controlling unit makes the tension of the belt large during a period of time having high possibility where the subject moves, and makes the tension of the belt small during a period of time having low possibility where the subject moves, corresponding to an elapse of time of an imaging operation performed by the MRI apparatus main unit.

6. The MRI apparatus according to claim 3, wherein
    the belt controlling unit changes the tension of the belt corresponding to an order of imaging protocols, when an imaging operation performed by the MRI apparatus main unit includes a plurality of imaging protocols that are continuously performed.

7. The MRI apparatus according to claim 3, wherein
    the belt controlling unit makes the tension of the belt during a rest time smaller compared with the tension of the belt during the imaging protocols prior to and following the rest time, when the rest time is provided between two consecutive imaging protocols.

8. The MRI apparatus according to claim 3, wherein
    the belt controlling unit makes the tension of the belt during the first imaging protocol larger compared with the tension of the belt during the imaging protocols following the first imaging protocol.

9. The MRI apparatus according to claim 3, wherein
    the belt controlling unit gradually makes the tension of the belt larger during operations of the imaging protocols, when the imaging protocols have a length equal to or more than a predetermined time.

10. The MRI apparatus according to claim 3, further comprising:
    a tension detecting unit, wherein
    the tension detecting unit makes the belt a released state when the tension of the belt becomes equal to or more than a predetermined value.

11. The MRI apparatus according to claim 3, further comprising:
    a tension detecting unit, wherein
    the tension detecting unit notifies when the tension of the belt becomes equal to or more than a first threshold value, and the tension detecting unit makes the belt a released state when the tension of the belt becomes equal to or more than a second threshold value.

12. The MRI apparatus according to claim 3, further comprising:
    a tension-fluctuation detecting unit that detects a fluctuation of the tension of the belt, wherein
    the tension-fluctuation detecting unit notifies when the tension of the belt fluctuates by equal to or more than a predetermined value within a predetermined time.

13. The MRI apparatus according to claim 3, further comprising:
    a monitoring unit that records a change in the tension of the belt accompanying an elapse of the imaging operation, wherein
    the change in the tension of the belt recorded by the monitoring unit is allowed to be checked after completion of the imaging operation.

14. A magnetic resonance imaging (MRI) methods comprising:
    controlling automatically a tension of a belt that fixes a subject onto a tabletop, wherein the tension is controlled by using a table that stores the tension corresponding to an imaging progress state of the subject.

* * * * *